United States Patent
Iwashita et al.

(10) Patent No.: US 8,100,515 B2
(45) Date of Patent: Jan. 24, 2012

(54) MULTILAYER PIEZOELECTRIC ACTUATOR AND LIQUID DISCHARGE HEAD

(75) Inventors: Shuzo Iwashita, Kirishima (JP); Yoshihiro Yuu, Kirishima (JP)

(73) Assignee: Kyocera Corporation, Kyoto (JP)

( * ) Notice: Subject to any disclaimer, the term of this patent is extended or adjusted under 35 U.S.C. 154(b) by 230 days.

(21) Appl. No.: 12/532,982

(22) PCT Filed: Mar. 18, 2008

(86) PCT No.: PCT/JP2008/054947
§ 371 (c)(1),
(2), (4) Date: Dec. 23, 2009

(87) PCT Pub. No.: WO2008/117700
PCT Pub. Date: Oct. 2, 2008

(65) Prior Publication Data
US 2010/0225710 A1 Sep. 9, 2010

(30) Foreign Application Priority Data

Mar. 27, 2007 (JP) .................... 2007-082452

(51) Int. Cl.
*B41J 2/045* (2006.01)
*H01L 41/187* (2006.01)
*H01L 41/047* (2006.01)

(52) U.S. Cl. ............ 347/71; 347/72; 310/358; 310/363

(58) Field of Classification Search .................. None
See application file for complete search history.

(56) References Cited

FOREIGN PATENT DOCUMENTS

| JP | 06-191941 | 7/1994 |
|---|---|---|
| JP | 2000-211968 | 8/2000 |
| JP | 2004-304028 | 10/2004 |
| JP | 2005-026369 | 1/2005 |
| JP | 2005-101274 | 4/2005 |

*Primary Examiner* — Matthew Luu
*Assistant Examiner* — Lisa Solomon
(74) *Attorney, Agent, or Firm* — DLA Piper LLP (US)

(57) ABSTRACT

A multilayer piezoelectric actuator and a liquid discharge head are provided which are equipped with dense piezoelectric ceramics having improved insulation performance. The multilayer piezoelectric actuator comprises a multilayered body comprising a plurality of piezoelectric ceramic layers containing a PZT phase as a main crystal phase; and an electrode layer containing Ag, which is disposed at least one of on the surface and in the interior of the multilayered body. A lattice constant c of c-axis of the PZT phase is 0.4085 nm to 0.4100 nm, and a ratio of the lattice constant c of the c-axis of the PZT phase and a lattice constant a of a-axis, namely, the ratio c/a, is 1.011 or more. A second phase containing Ag different from the PZT phase is not substantially contained in the piezoelectric ceramic layer. A $Zn_2SiO_4$ phase is contained at grain boundaries of the PZT phase, and a $Pb_2SiO_4$ phase is not substantially contained at the grain boundaries of the PZT phase.

7 Claims, 3 Drawing Sheets

MULTILAYER PIEZOELECTRIC ACTUATOR AND LIQUID DISCHARGE HEAD

CROSS-REFERENCE TO THE RELATED APPLICATIONS

This application is a national stage of international application No. PCT/JP2008/054947, filed on Mar. 18, 2008, which also claims the benefit of priority under 35 USC 119 to Japanese Patent Application No. 2007-082452, filed Mar. 27, 2007, the entire contents of which are incorporated herein by reference.

TECHNICAL FIELD

The invention relates to a multilayer piezoelectric actuator and a liquid discharge head using the same, more particularly, a multilayer piezoelectric actuator and a liquid discharge head using the same which are suitably used in inkjet printers, injectors for fuel injection, and the like.

BACKGROUND ART

In recent years, the use of an inkjet system recording device as a recording device for outputting information to a recording medium has been widespread rapidly along with the spread of personal computers and the advancement of multimedia.

An inkjet head is mounted on the inkjet system recording device. This type of inkjet head has a pressurizing means within an ink passage filled with ink. By the pressurizing means, the ink within the ink passage is pressurized and discharged as ink droplets from an ink discharge hole. Thermal system equipped with a heater as the pressurizing means in which ink is heated and boiled by the heater, and the ink is pressurized by bubbles generated in the ink passage; and piezoelectric system equipped with a piezoelectric element as the pressurizing means in which bending displacement of part of the ink passage filled with ink is caused by the piezoelectric element, and the ink in the ink passage is mechanically pressurized are generally known.

Figure 3:
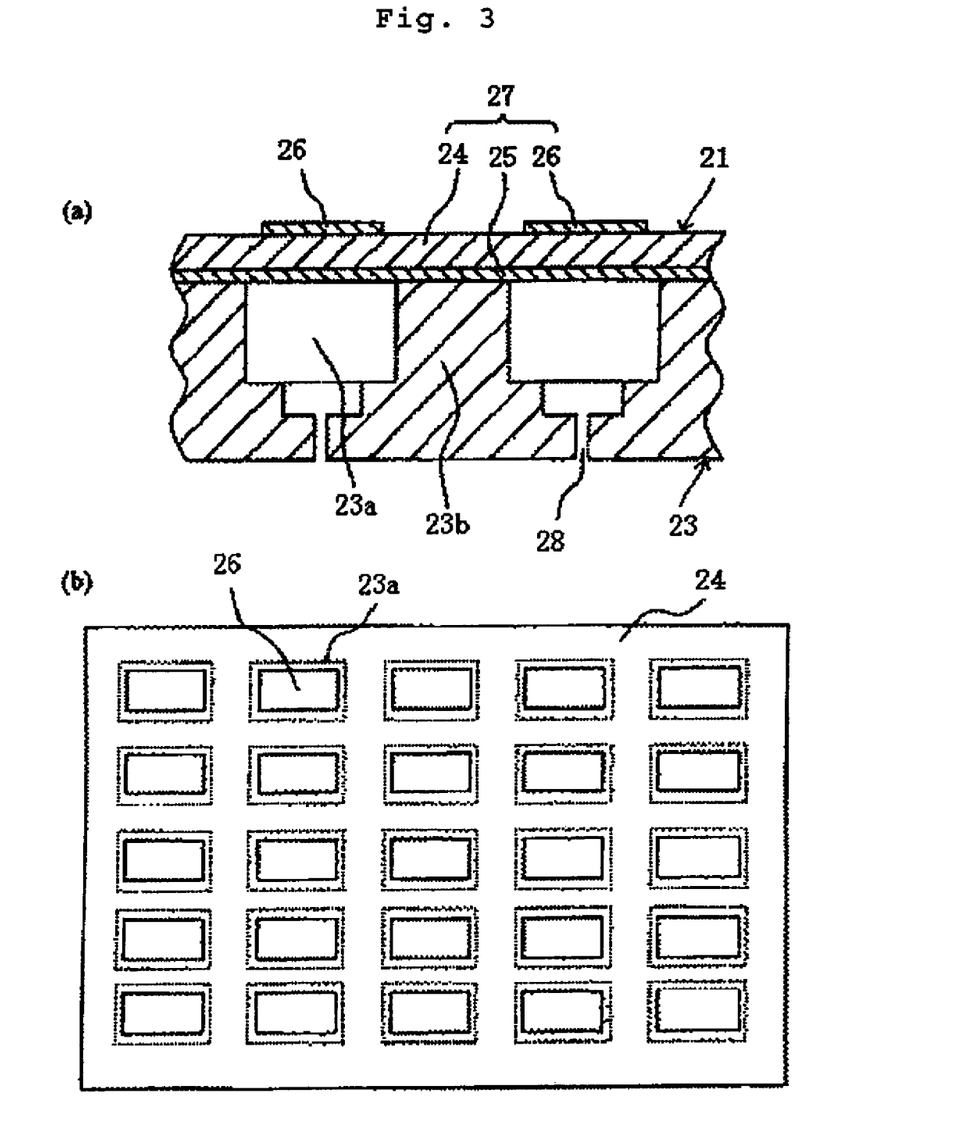
FIG. 3(a) and FIG. 3(b) are a schematic sectional view and a plan view, respectively, showing the structure of a conventional print head.

A print head used in an inkjet recording device using the piezoelectric system has, for example, the structure as shown in FIG. 3(a) in which a plurality of grooves are arranged side by side as ink passages 23a, and an actuator 21 is disposed on a passage member 23 with a partition wall 23b formed as a wall for partitioning the individual ink passages 23a.

The actuator 21 is made up of a plurality of displacement elements 27 by forming an internal electrode 25 on one main surface of a piezoelectric ceramic layer 24, and by forming a plurality of individual electrodes 26 on the other main surface. The actuator 21 is connected to the passage member 23 so that the individual electrodes 26 are located immediately above the ink passage 23a as an opening part of the passage member 23.

By applying a voltage between the internal electrode 25 and these individual electrodes 26, these displacement elements 27 are oscillated so that the ink within the ink passage 23a is pressurized to discharge ink droplets from an ink discharge hole 28 opening into the bottom surface of the passage member 23.

It is possible to contribute to high speed and high accuracy of inkjet printers by constructing a print head in which a large number of individual electrodes 26 are disposed side by side at equal pitches on the piezoelectric ceramic layer 24, and a large number of displacement elements 27 are disposed as shown in FIG. 3(b), and by independently controlling the individual displacement elements 27.

Patent document 1 discloses the high-endurance piezoelectric ceramics used in the above piezoelectric actuator. The piezoelectric ceramics employs, as a main crystal phase, oxide ceramics of a perovskite-type crystal structure having an average particle diameter of 1 to 8 μm and exhibiting piezoelectric, performance, and contains at least one kind of fine grains selected from $Al_2O_3$, MgO, $ZrO_2$, AgO, Ag and Pt, each having an average grain diameter of 0.5 μm or less, in a proportion of 0.1 to 5.0% by volume. The time to reach rupture or fracture by repetitive applications of high-voltage sine-wave of 2 kV/mm and 1 kHz along the polarization direction is 100 hours or more, and 5% or more of particles in the fractured section correspond to intergranular fracture.

Patent document 1: Japanese Unexamined Patent Application Publication No. 2000-211968

DISCLOSURE OF THE INVENTION

Problems to be Solved by the Invention

However, the piezoelectric ceramics described in the patent document 1 has, within the crystal, a second phase composed of a specific ingredient different from the main crystal phase of the perovskite-type crystal structure exhibiting piezoelectric performance. Therefore, when the above actuator is manufactured by using the piezoelectric ceramics described in the patent document 1, Ag particles of the internal electrode layer containing Ag—Pd alloy are usually precipitated at grain boundaries. This has caused the problem that the insulation performance of the piezoelectric ceramics is remarkably deteriorated.

On the other hand, Si is liable to be contaminated as impurity during manufacturing of the piezoelectric actuator. Specifically, when wet grinding using water is carried out in a raw material preparation, Si is contained in the water and hence liable to be contaminated into the raw material. If Si is contaminated into the raw material, the $Pb_2SiO_4$ phase of the grain boundary part of the main crystal phase exhibiting the piezoelectric performance of the piezoelectric ceramic layer might be contained. If the $Pb_2SiO_4$ phase is contained in the grain boundary part, the following problem has occurred. That is, when the piezoelectric ceramics is used as a multilayer piezoelectric actuator, the $Pb_2SiO_4$ phase of the grain boundary part is fractured by being driven or displaced. Therefore, when the multilayer piezoelectric actuator is used under environment in the presence of an electrolyte, for example, environment to allow for contact with ink or the like using water as a solvent, the electrolyte enters from the fractured grain boundary, and the insulation performance of the piezoelectric ceramic layer is deteriorated.

The following problem has also occurred. That is, when the contamination of Si is reduced as much as possible in order to reduce the precipitation of the $Pb_2SiO_4$ phase, and the crystal phase containing Si is substantially eliminated, the sintering properties of the piezoelectric ceramics is deteriorated, failing to ensure insulation reliability.

Therefore, an advantage of the invention is to provide a multilayer piezoelectric actuator and a liquid discharge head which are equipped with dense piezoelectric ceramics having improved insulation performance.

Means for Solving the Problems

In the multilayer piezoelectric actuator of the invention, an electrode layer containing Ag is disposed at least one of on the surface and in the interior of a multilayered body comprising a plurality of piezoelectric ceramic layers containing a PZT phase as a main crystal phase. A lattice constant c of c-axis of the PZT phase is 0.4085 nm to 0.4100 nm, and a ratio of the lattice constant c of the c-axis of the PZT phase and a lattice constant a of a-axis, namely, the ratio c/a, is 1.011 or more. A second phase containing Ag different from the PZT phase is not substantially contained in the piezoelectric ceramic layer. A $Zn_2SiO_4$ phase is contained and a $Pb_2SiO_4$ phase is not substantially contained at the grain boundaries of the PZT phase.

An average crystal particle diameter of the PZT phase is preferably 2.5 μm or less. A lattice constant of the c-axis of the PZT phase measured by grinding the piezoelectric ceramic layer into powder having an average particle diameter of 2.5 μm is preferably 1.002 times to 1.005 times of the lattice constant c of the c-axis of the PZT phase before grinding.

When the piezoelectric ceramic layer is subjected to load fracture, 80% or more of the fracture surface thereof preferably become intergranular fracture mode. The thickness of the piezoelectric ceramic layer is preferably 50 μm or less.

Preferably, the electrode layer contains Ag—Pd alloy, and the ratio of Ag is 60% to 85% by volume.

In the liquid discharge head of the invention, the above multilayer piezoelectric actuator is connected onto a passage member having a plurality of ink passages, and displacement elements constituting the above multilayer piezoelectric actuator are disposed on the ink passages of the passage member.

Effect of the Invention

In the multilayer piezoelectric actuator of the invention, the second phase containing Ag different from the PZT phase is not substantially contained at the grain boundaries of the PZT phase as the main crystal phase in the piezoelectric ceramic layer. This is because Ag diffuses from the internal electrode layer containing Ag into the crystal particles of the main crystal phase exhibiting piezoelectric performance. Further, the lattice constant ratio c/a of the PZT phase is shifted to the tetragonal side of 1.011 or more, thereby reducing generation of a liquid phase containing Ag, and reducing generation of a grain boundary phase containing Ag. Additionally, the lattice constant c of the c-axis of the PZT phase (multilayer piezoelectric ceramics) is 0.4085 nm to 0.4100 nm. Therefore, the substitution solid solution of Ag into the crystal particles can be reduced, thus producing the effect on improvement of insulation performance and reduction of piezoelectric performance deterioration.

Since the $Pb_2SiO_4$ phase is not substantially contained at the grain boundaries of the PZT phase, it is avoidable that a fragile grain boundary part containing the $Pb_2SiO_4$ phase is fractured during driving of the multilayer piezoelectric actuator. Hence, when the multilayer piezoelectric actuator is used under environment in the presence of an electrolyte, for example, environment to allow for contact with ink or the like using water as a solvent, the entering of the electrolyte is reduced, thereby reducing the insulation performance deterioration of the piezoelectric ceramic layer.

Further, the piezoelectric ceramic layer can be densified owing to a small number of voids, because the $Zn_2SiO_4$ phase is contained at the grain boundaries of the PZT phase.

When the average crystal particle diameter of the PZT phase is 2.5 μm or less, the substitution solid solution of Ag into the piezoelectric ceramic layer can be reduced.

When the lattice constant of the c-axis of the PZT phase measured by grinding the piezoelectric ceramic layer into powder having an average particle diameter of 2.5 μm is 1.002 times to 1.005 times of the lattice constant of the c-axis of the PZT phase before grinding, compressive stress is applied as residual stress in a direction perpendicular to the laminating direction of the multilayer piezoelectric actuator. This reduces the occurrence of cracks during driving of the multilayer piezoelectric actuator. The magnitude of the compressive stress is correlated with the ratio of the lattice constant of the powder obtained by grinding the piezoelectric ceramic layer to the lattice constant of the piezoelectric ceramic layer. That is, the residual stress is released in the state of the powder after grinding. Therefore, it can be said that the compressive stress increases as the lattice constant after grinding becomes larger than the lattice constant before grinding. Accordingly, when the lattice constant after grinding is 1.002 times or more of the lattice constant before grinding, the compressive stress is exerted in the direction perpendicular to the laminating direction of the multilayer piezoelectric actuator, enabling to reduce the occurrence of cracks. When the lattice constant after grinding is 1.005 times or less of the lattice constant before grinding, it is capable of reducing piezoelectric performance deterioration due to large residual stress of the multilayer piezoelectric actuator.

When the piezoelectric ceramic layer is subjected to load fracture, and consequently 80% or more of the fracture surface thereof become intergranular fracture mode, the amount of Ag precipitation at the grain boundaries is decreased.

When the thickness of the piezoelectric ceramic layer is 50 μm or less, concentration variation of the diffused Ag within the piezoelectric ceramic layer becomes small, achieving uniform characteristics.

When the electrode layer contains Ag—Pd alloy, and the ratio of Ag is 60% to 85% by volume, the amount of Ag diffusion is decreased, allowing a more effective realization of intergranular fracture.

In accordance with the liquid discharge head of the invention, the use of the above multilayer piezoelectric actuator reduces the fracture of the piezoelectric ceramic layer, and also reduces the insulation performance deterioration of the piezoelectric ceramic layer even if used under environment in the presence of an electrolyte, for example, environment to allow for contact with ink or the like using water as a solvent. Hence, it is capable of reducing the situation where a liquid is not discharged or the amount of discharged liquid becomes unstable due to these causes.

PREFERRED EMBODIMENTS FOR CARRYING OUT THE INVENTION

Figure 1:
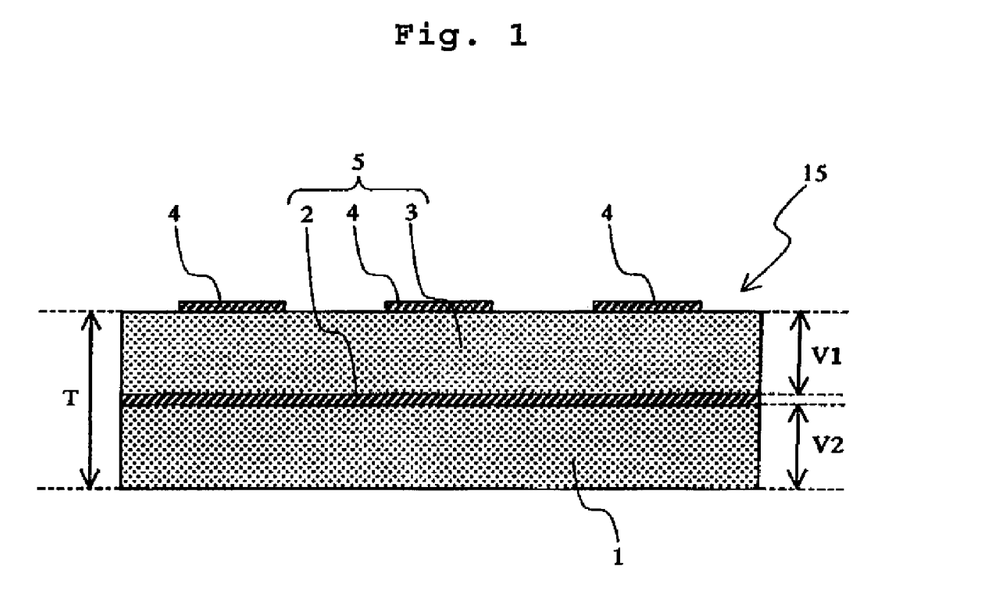
FIG. 1 is an enlarged schematic sectional view showing a multilayer piezoelectric actuator according to a preferred embodiment of the invention.

A preferred embodiment of the multilayer piezoelectric actuator of the invention will be described below in detail with reference to the accompanying drawings. FIG. 1 is an enlarged schematic longitudinal sectional view showing the multilayer piezoelectric actuator of the present preferred embodiment. As shown in FIG. 1, the multilayer piezoelectric actuator 15 of the present preferred embodiment is constituted by a ceramic diaphragm 1 (a piezoelectric ceramic layer), an internal electrode 2, a piezoelectric ceramic layer 3 and a surface electrode 4, in which the internal electrode 2, the piezoelectric ceramic layer 3 and the surface electrode 4 are laminated in this order on the ceramic diaphragm 1.

The internal electrode 2 and the surface electrode 4 constitute the electrodes of the multilayer piezoelectric actuator 15, and a plurality of the surface electrodes 4 are formed on the surface of the piezoelectric ceramic layer 3. This forms a plurality of displacement elements 5 constituted by holding the piezoelectric ceramic layer 3 between the internal electrode 2 and the surface electrodes 4.

The piezoelectric ceramic layer 3 is then polarized. Next, a lead wire is connected to the internal electrode 2, and the lead wire is electrically connected to an external power source. By applying a drive voltage between the internal electrode 2 and the surface electrodes 4, the displacement elements 5 are displaced, and the multilayer piezoelectric actuator 15 is driven.

The ceramic diaphragm 1 is composed of piezoelectric ceramics, and the piezoelectric ceramic layer 3 is composed of piezoelectric ceramics having substantially the same composition as the ceramic diaphragm 1.

The piezoelectric ceramics contains a PZT (lead zirconate titanate) phase as a main crystal phase. The PZT has a high absolute value of a piezoelectric constant $d_{31}$ and also exhibits high wettability for the electrodes (the internal electrode 2 and the surface electrodes 4), thereby enhancing the adhesion strength for the electrodes.

Especially, in the present preferred embodiment, the composition ratio of A-site and B-site of the perovskite crystal structure of the piezoelectric ceramics such as lead zirconate titanate-based compounds (namely, the piezoelectric ceramic layer 3 and the ceramic diaphragm 1) is preferably as follows: {A-site/B-site}≦1. This reduces generation of the liquid phase of Ag and Pb, thereby reducing generation of a grain boundary phase. Consequently, the lattice constant ratio c/a of the piezoelectric ceramics can be shifted to the tetragonal side of 1.011 or more. Further, a small number of precipitated phases exist at the grain boundary part, enabling to increase the probability that the fracture surface will become intergranular fracture mode. In the above c/a, the ratio of the lattice constant of a-axis and the lattice constant of c-axis can be found from X-ray diffraction (XRD).

The grain boundary part of crystal particles as the PZT phase does not substantially contain a second phase containing Ag different from the main crystal phase exhibiting piezoelectric performance. This improves the insulation performance of the piezoelectric ceramic layer.

The grain boundary part of the PZT phase contains a $Zn_2SiO_4$ phase. Since the $Zn_2SiO_4$ phase is precipitated into the piezoelectric ceramic layer, the number of voids is decreased, permitting densification and enhancing insulation reliability. Additionally, Zn enhances the stability of the PZT phase.

The grain boundary part of the PZT phase does not substantially contain the $Pb_2SiO_4$ phase. The substantial absence of the $Pb_2SiO_4$ phase reduces the situation where the $Pb_2SiO_4$ phase having a fragile grain boundary part is fractured by being driven or displaced as a multilayer piezoelectric actuator, and the displacement of the multilayer piezoelectric actuator becomes unstable, or no displacement occurs. Specifically, even when the multilayer piezoelectric actuator is used under environment in the presence of an electrolyte, for example, environment to allow for contact with ink or the like using water as a solvent, the electrolyte entering from the fractured grain boundary can be reduced, thereby eliminating the insulation performance deterioration of the piezoelectric ceramic layer.

Especially, when the thickness of the piezoelectric ceramic layer is 100 μm or less, the piezoelectric ceramic layer is required to have high insulation performance and strength. Therefore, as describe earlier, the grain boundary part of the PZT phase preferably contains the $Zn_2SiO_4$ phase and does not contain the $Pb_2SiO_4$ phase.

The piezoelectric ceramics forming the piezoelectric ceramic layer 3 and the ceramic diaphragm 1 preferably contains at least one kind selected from Sr, Ba, Ni, Sb, Nb, Yb and Te. This produces more stable piezoelectric ceramics (the multilayer piezoelectric actuator 15). Examples of this piezoelectric ceramics include those in which the above-mentioned Zn is contained, and Pb $(Zn_{1/3}Sb_{2/3})O_3$ and $Pb(Ni_{1/2}Te_{1/2})O_3$ as sub ingredients are brought into solid solution.

In particular, the piezoelectric ceramics preferably further contains an alkaline earth element as an element constituting the A-site. As the alkaline earth element, Ba and Sr are preferred because they can produce high displacement. Containing Ba in the range from 0.02 to 0.08 mol and Sr in the range from 0.02 to 0.12 mol is advantageous for obtaining large displacement in the composition where the PZT phase is tetragonal.

Examples of the above piezoelectric ceramics include those expressed by $Pb_{1-x-y}Sr_xBa_y(Zn_{1/3}Sb_{2/3})_a(Ni_{1/2}Te_{1/2})_b$ $Zr_{1-a-b-c}Ti_cO_3+\alpha$ % by mass $Pb_{1/2}NbO_3$, where $0 \leq x \leq 0.14$, $0 \leq y \leq 0.14$, $0.05 \leq a \leq 0.1$, $0.002 \leq b \leq 0.01$, $0.44 \leq c \leq 0.50$, and $\alpha = 0.1$ to 1.0.

The piezoelectric ceramics requires that the lattice constant of the c-axis of the PZT phase be 0.4085 nm to 0.4100 nm, thereby reducing substitution solid solution of Ag. For adjusting the lattice constant of the c-axis of the PZT phase to the above range, for example, the proportion of Ag in the Ag/Pd of the internal electrode may be set to 90% by volume or less. Alternately, the composition ratio of A-site and B-site when preparing the raw material of PZT may be set to 1 or less.

Preferably, compressive stress is applied as residual stress in a direction perpendicular to the laminating direction of the multilayer piezoelectric actuator, specifically, the lattice constant of the c-axis of the PZT phase measured by grinding the piezoelectric ceramic layer is 1.002 times to 1.005 times of the lattice constant c of the c-axis of the PZT phase before grinding. This reduces the occurrence of cracks during driving of the multilayer piezoelectric actuator. As used herein, the term "grinding" means grinding in a mortar or the like into powder having an average particle diameter of 1 to 3 μm.

In the piezoelectric ceramics, the average crystal particle diameter of the PZT phase is preferably 2.5 μm or less. This is more effective in reducing the substitution solid solution of Ag into the piezoelectric ceramics such as PZT. For adjusting the average crystal particle diameter to the above range, for example, the composition ratio of the A-site and the B-site when preparing the raw material of PZT may be set to 1 or less. The average crystal particle diameter can be found, for example, by observing with a scanning electron microscope (SEM) and using the intercept method, as described later.

The total thickness T of the multilayer piezoelectric actuator 15 is desirably 100 μm or less, preferably 60 μm or less, more preferably 45 μm or less, in order to enlarge the displacement.

The ratio of a thickness V1 of the piezoelectric ceramic layer 3 and a thickness V2 of the ceramic diaphragm 1, namely, the ratio V1/V2, is preferably 0.3 to 1.5. This enables to decrease the voltage exerted on the piezoelectric ceramic layer 3 during driving, thereby reducing endurance deterioration.

In accordance with the present preferred embodiment, the electrodes (the internal electrode 2 and the surface electrodes 4) manufactured by simultaneous burning are preferably composed of silver palladium alloy containing silver of 60 to 85% by volume, preferably 70 to 80% by volume. This decreases the amount of Ag diffusion, and hence intergranular fracture can be more effectively realized.

Next, a method of manufacturing the multilayer piezoelectric actuator will be described.

Firstly, PZT powder having a purity of 99% and an average particle diameter of 1 μm or less is prepared as a raw material (piezoelectric ceramic raw material powder). The amount of Si in the piezoelectric ceramic powder composition is set to 10 ppm to 200 ppm by using $ZrO_2$ or the like containing Zr as a prime raw material, and by adjusting the amount of Si contained in a prime raw material used for preparation and in water used for preparation. By setting the amount of Si in the piezoelectric ceramic powder to 10 ppm or more, $Zn_2SiO_4$ accelerates the sintering of the piezoelectric ceramics in the burning step described later, thereby producing dense piezoelectric ceramics with a small number of voids. Further, by setting the amount of Si in the piezoelectric ceramic powder to 200 ppm or less, the $Pb_2SiO_4$ phase is substantially eliminated at the grain boundaries of the piezoelectric ceramics after burning. It is therefore capable of reducing the situation where the $Pb_2SiO_4$ phase having a fragile grain boundary part is fractured by being driven or displaced as a multilayer piezoelectric actuator, and consequently the displacement of the multilayer piezoelectric actuator becomes unstable, or no displacement occurs.

For adjusting the amount of Si in the piezoelectric ceramic powder to the above-mentioned range, the amount of impurity Si contained in individual raw materials used may be managed, and if necessary, $SiO_2$ or the like may be added as a prime raw material For minimizing contamination of Si from matters other than the prime raw materials, it is desirable to manage the content of Si in a solvent used for preparation. The content of Si in the solvent is preferably 0.1 ppm or less. Water is suitable as the solvent. As a method for controlling the content of Si in water to 0.1 ppm or less, there are, for example, treatment using an ion exchange resin filter.

The piezoelectric ceramic powder is manufactured as follows. That is, PbO, $ZrO_2$, $TiO_3$ and ZnO, each under management of the amount of Si impurities, and if necessary, additives thereof (oxides, carbonates and the like of necessary elements) are mixed and ground by a ball mill until their average grain diameters reach 0.5 to 0.8 μm. The obtained powder is calcined at 900 to 1000° C., and the calcined powder is ground by the ball mill until its average grain diameter reaches 0.5 to 0.8 μm.

To this piezoelectric ceramic powder, a suitable organic binder is added and formed into a tape shape. As an internal electrode, an Ag—Pd paste is applied to part of a manufactured green sheet, and the green sheet is then laminated on the internal electrode. This is pressed at a pressure of 10 to 50 MPa and then cut into a desired shape. This is debindered at approximately 400° C., followed by burning. After burning, a desired surface electrode is formed on the surface and polarized, thereby obtaining the multilayer piezoelectric actuator as a multilayer piezoelectric body.

Thus, the piezoelectric ceramic layer is manufactured by simultaneous burning with the internal electrode layer, so that Ag is allowed to diffuse from the internal electrode into the PZT crystal particles. As a result, the second phase containing Ag different from the primary crystal phase exhibiting piezoelectric performance is not substantially contained, thereby improving insulation performance.

Here, the description "the second phase containing Ag is not substantially contained" means that it cannot be detected by observation at 100000 times magnification using a transmission electron microscope (TEM) and energy dispersive spectrometry (EDS). Similarly, the description "the $Pb_2SiO_4$ phase is not substantially contained" means that it cannot be detected by observation at 100000 times magnification using the transmission electron microscope (TEM) and energy dispersive spectrometry (EDS).

When a multilayered body is manufactured by laminating a green sheet, a piezoelectric ceramics having substantially the same composition as the green sheet, and a restriction sheet are preferably disposed on both surfaces or one surface of the multilayered body and then press-adhered. The effect on warp decrease of the multilayered body can be expected by reducing the shrinkage of the outside green sheet by the restriction sheet.

The green density before sintering is preferably 4.5 g/cm$^2$ or more. Sintering can be carried out at a lower temperature by raising the green density before sintering to 4.5 g/cm$^2$ or more. The evaporation of Pb can be reduced by further raising the green density.

The multilayer piezoelectric actuator of the present preferred embodiment features a high displacement. Especially, the multilayer piezoelectric actuator is preferably connected to a support member.

The multilayer piezoelectric actuator of the present preferred embodiment is preferably driven, provided that the ratio of the electric field strength E during driving and the electric field strength Ec of the piezoelectric ceramic layer, namely, the ratio E/Ec, is smaller than 1. This decreases the contribution of domain rotation in the driven part, and the multilayer piezoelectric actuator is less liable to be deteriorated in the amount of displacement even if it is driven over a long period of time, thereby achieving stable displacement.

The multilayer piezoelectric actuator of the invention is applicable to the liquid discharge head for discharging a liquid, and suitably applicable to inkjet print heads for use in recording devices using inkjet system, because the plurality of displacement elements are disposed on the single substrate (the ceramic diaphragm) as described above. A preferred embodiment using the multilayer piezoelectric actuator of the invention as a print head will be described below in detail with reference to the drawings.

Figure 2:
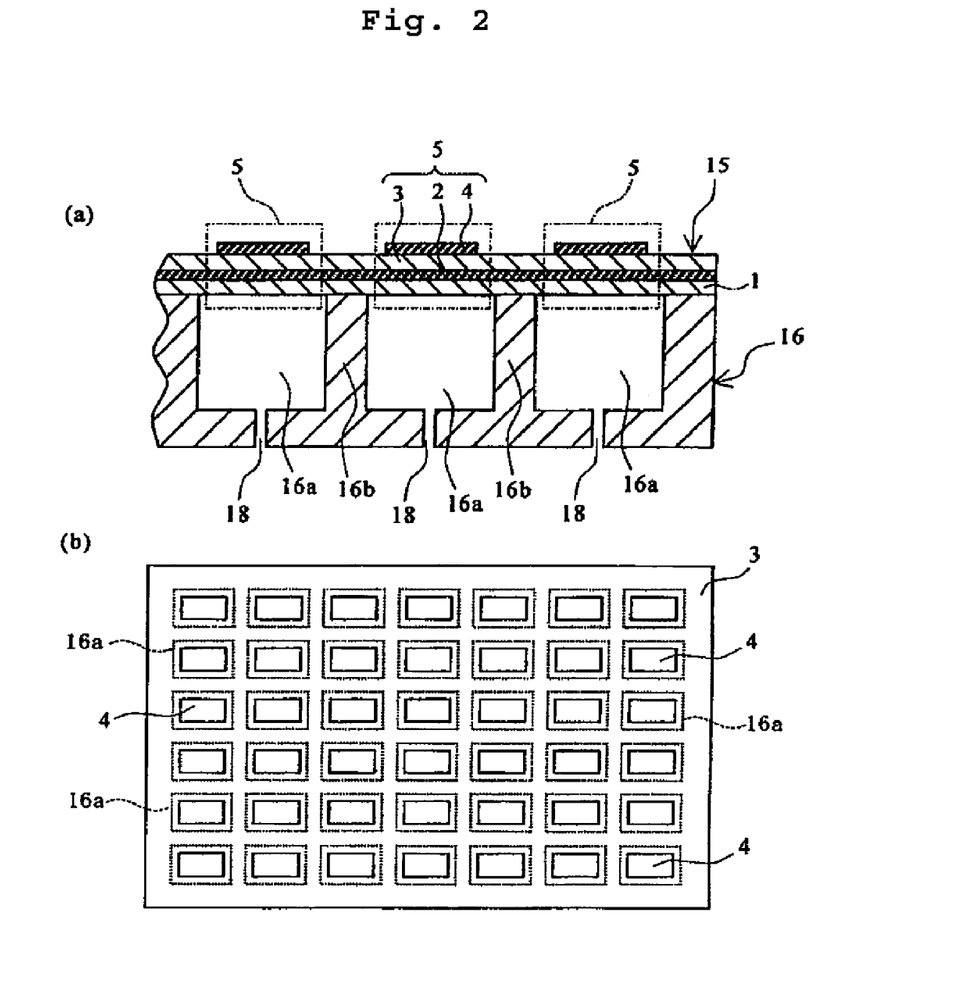
FIG. 2(a) is a schematic longitudinal sectional view showing a print head according to a preferred embodiment of the invention.
FIG. 2(b) is a plan view thereof.

FIG. 2(a) is a schematic sectional view showing the print head of the present preferred embodiment. FIG. 2(b) is a plan view of the print head of the present preferred embodiment. In FIGS. 2(a) and 2(b), the same or like parts as the foregoing structure of FIG. 1 are identified by the same reference numerals, and the descriptions thereof are omitted here.

In the inkjet print head, the multilayer piezoelectric actuator 15 described above is connected onto a passage member 16, as shown in FIGS. 2(a) and 2(b). In the passage member 16, a plurality of ink passages 16a are disposed side by side, and partition walls 16b are formed as the wall to partition the individual ink passages 16a. The multilayer piezoelectric actuator 15 is connected with adhesive or the like so that the ceramic diaphragm 1 is brought into contact with the spaces of the ink passages 16a. More specifically, the multilayer piezoelectric actuator 15 is connected so that the individual surface electrodes 4 of the displace elements 5 correspond to the individual ink passages 16a.

That is, in the above inkjet print head, the internal electrode 2, the piezoelectric ceramic layer 3 and the surface electrodes 4 are laminated in this order on the ceramic diaphragm 1, and the multilayer piezoelectric actuator 15, in which a plurality of the surface electrodes 4 are disposed on the surface of the piezoelectric ceramic layer 3, is bonded to the passage member 16 so that the surface electrodes 4 are disposed immediately above the ink passages 16a.

By applying a voltage from a drive circuit to between the surface electrodes and the internal electrode 2, the ink within the ink passage 16a corresponding to the displacement element 5 causing displacement by the applied voltage is pressurized thereby to oscillate the multilayer piezoelectric actuator 15, so that the ink within the ink passage 16a is discharged as ink droplets from an ink discharge hole 18 opening into the bottom surface of the passage member 16.

A print head using an inexpensive IC can be achieved by employing the multilayer piezoelectric actuator of the invention as the actuator of the above print head. The print head has excellent displacement performance and hence enables high-speed and high-accuracy discharge, thus providing the print head suitable for high speed printing. By mounting the print head of the invention on, for example, a printer equipped with an ink tank for supplying ink to the above print head and a recording paper transport mechanism for printing onto a recording paper, higher-speed and higher-accuracy printing than conventional ones can be achieved easily.

Preferably, the piezoelectric ceramic layer 3 is composed of piezoelectric ceramics having the same composition as the ceramic diaphragm 1. However, the composition of the piezoelectric ceramic layer 3 need not completely match the composition of the ceramic diaphragm 1, and the composition thereof may differ within the range in which it is capable of producing the effect of the invention.

Although the above preferred embodiment has described the case where both the ceramic diaphragm 1 and the piezoelectric ceramic layer 3 are constituted by a single layer, the invention is not limited thereto. Alternatively, the ceramic diaphragm and/or the piezoelectric ceramic layer may be constituted by a plurality of layers. In this case, it is easy to adjust the thickness of the multilayer piezoelectric actuator.

The invention will be described below in more detail based on an example, but the invention is not limited to the following example.

Examples

A multilayer piezoelectric body was manufactured, and this was applied to an inkjet print head as an actuator. Firstly, as a raw material, piezoelectric ceramic powder containing lead zirconate titanate of 99% purity or more and 0.4% by mass of Zn was prepared (Table 1 shows the molar ratio of Zr/Ti, A/B ratio, and the amount of Si in the piezoelectric ceramic powder (in synthetic raw material)).

Into the powder of piezoelectric ceramic material composed mainly of lead zirconate titanate, butyl methacrylate as a water-based binder, polycarboxylic acid ammonium salt as a dispersing agent, and isopropyl alcohol as a solvent, and deionized water were respectively added and mixed to obtain slurry. This slurry is applied by doctor blade method onto a carrier film in the shape of a sheet having a thickness of 30 μm, thereby manufacturing a green sheet. This green sheet was used for both a piezoelectric layer and a ceramic diaphragm. The content of Si in the deionized water was adjusted to 0.1 ppm or less by using an ion exchange resin filter.

An internal electrode was formed by printing an internal electrode paste containing Ag—Pd alloy powder in a thickness of 4 μm on the surface of the green sheet for the ceramic diaphragm. With the surface having the printed internal electrode facing up, the green sheet for the piezoelectric layer was laminated on the green sheet for the ceramic diaphragm, followed by pressure press, resulting in a multilayered body.

This multilayered body was degreased and then retained in an atmosphere of 99% oxygen or more for four hours, followed by sintering, thereby manufacturing a multilayered body consisting of the piezoelectric ceramic layer, the diaphragm and the internal electrode. It should be noted that only the sintering temperature of Sample No. 36 was 1080° C. Next, a surface electrode was formed on the surface of the piezoelectric ceramic layer. Specifically, the surface electrode was formed by applying an Au paste by screen printing, followed by burning at 600 to 800° C. in the atmosphere. Finally, a lead wire was connected to the surface electrode by soldering, resulting in the multilayer piezoelectric actuator 15 having the shape as shown in FIGS. 2(a) and 2(b) (Samples Nos. 1 to 14, 16 to 19, 31, 36 and 37 in Tables 1 and 2).

The multilayer piezoelectric actuator 15 was obtained by manufacturing a multilayered body similarly to the above, except for the preparation of powder by adding 1% by volume of Ag into the above piezoelectric ceramic powder (Samples Nos. 15 and 27 in Tables 1 and 2).

The multilayer piezoelectric actuator 15 was obtained by manufacturing a multilayered body similarly to the above, except for the use of piezoelectric ceramic powder manufactured by using $ZrO_3$ containing 0.3% by mass of $SiO_2$ as impurity (Samples Nos. 20 to 26 and 28 in Tables 1 and 2).

The multilayer piezoelectric actuator 15 was obtained by manufacturing a multilayered body similarly to the above, except for the use of piezoelectric ceramic powder manufactured by using $ZrO_3$ containing 0.3% by mass of $SiO_2$ as impurity, and the preparation of powder by adding 1% by volume of Ag into the above piezoelectric ceramic powder (Sample No. 27 in Tables 1 and 2).

The multilayer piezoelectric actuator 15 was obtained by manufacturing a multilayered body similarly to the above, except for the preparation of piezoelectric ceramic powder using highly-purified $ZrO_2$ (Sample No. 35 in Tables 1 and 2).

The multilayer piezoelectric actuator 15 was obtained by manufacturing a multilayered body similarly to the above, except that piezoelectric ceramic powders having different contents of Si were prepared by using a mixture of the above $ZrO_2$ having different contents of Si impurities (Samples Nos. 30 and 32 to 34 in Tables 1 and 2).

Liquid discharge heads were manufactured by adhesively connecting the passage member 15 shown in FIGS. 2(a) and 2(b) to the multilayer piezoelectric actuators thus obtained, respectively.

Tables 1 and 2 show details of the multilayer piezoelectric actuators and the liquid discharge heads thus obtained. In these Tables 1 and 2, the individual evaluation values were found as follows.

<Content of Si in Piezoelectric Ceramic Powder (Synthetic Raw Material)>

Measurement was made by ICP (inductively coupled plasma) atomic emission spectrometry. It should be noted that the content of Si in the piezoelectric ceramics after burning was not different from the content of Si in the synthetic raw material.

<Lattice Constant Ratio c/a>

The lattice constant ratio c/a of each piezoelectric ceramic layer was found by applying a measurement spot to the location where the piezoelectric ceramics of the multilayer piezoelectric actuator was exposed, and by calculating the lattice constant a of a-axis and the lattice constant c of c-axis from XRD.

<Lattice Constant of c-Axis>

The lattice constant c of the c-axis of the piezoelectric ceramic layer (before grinding) was found as follows. That is, to the location where the piezoelectric ceramics of the multilayer piezoelectric actuator was exposed, the spot of XRD was applied and measured to obtain d(002) diffraction angle 2θ. From Bragg relationship, calculation was made according to the equation: $2d \sin \theta = \lambda$. The lattice constant of the c-axis of the ground piezoelectric ceramic layer (after grinding) was obtained by grinding the piezoelectric ceramic layer in an agate mortar into powder having an average particle diameter of 2.5 μm, followed by measurement in the same manner as above.

<Average Crystal Particle Diameter>

The average crystal particle diameter of each piezoelectric ceramic layer was found by a SEM observation of the surface thereof at 3000 times magnification, using intercept method.

<Intergranular Fracture Ratio>

Each multilayer piezoelectric actuator was subjected to bending fracture, and a SEM observation of the fracture surface was carried out. From a two-dimensional image thereof, the area causing intergranular fracture was found by an image analysis apparatus.

<Insulation Resistance of Multilayer Piezoelectric Actuator>

The insulation resistance of each multilayer piezoelectric actuator was found as follows. The insulation resistance after a DC voltage of 1 kV/mm was applied between the surface electrodes and the internal electrode of the above multilayer piezoelectric actuator (the distance between the electrodes was 20 μm, and the surface electrode shape was a square whose side was 300 μm) for one minute was measured by an insulation resistance meter.

<Presence/Absence of Second Phase Containing Ag>

The presence/absence of the second phase precipitation containing Ag in the piezoelectric ceramic layer was determined based on whether or not it could be detected by observation at 100000 times magnification using a transmission electron microscope (TEM) and energy dispersive spectrometry (EDS). That is, the case where the second phase could be observed by TEM and detected by EDS was denoted by "presence," and the case where the second phase could not be observed by TEX and could not be detected by EDS was denoted by "absence."

<Presence/Absence of $Zn_2SiO_4$ Phase and $Pb_2SiO_4$ Phase>

The presence/absence of the $Zn_2SiO_4$ phase and the $Pb_2SiO_4$ phase were determined similarly to the above presence/absence of the second phase containing Ag.

<Drive Test>

The multilayer piezoelectric actuator was driven continuously over $1 \times 10^{10}$ cycles by supplying ink using water as a solvent to the passage member, and by applying drive voltage waveforms having a peak voltage 25V, frequency 2 kHz and a duty ratio 80%, to each multilayer piezoelectric actuator.

These test results are shown in Tables 1 and 2. In these Tables 1 and 2, Samples Nos. 10, 13 to 15, 19 to 29, 34 and 35 are beyond the scope of the invention. In Table 2, the term "total thickness of ceramics" means the total thickness T of the multilayer piezoelectric actuator.

TABLE 1

| Sample No. [1] | Main crystal phase | Zr/Ti (molar ratio) | A/B (molar ratio) | Amount of Si in synthetic raw material (ppm) | c/a | Lattice constant of c-axis Before grinding (nm) | Lattice constant of c-axis After grinding (nm) | After grinding/ Before grinding | Total thickness of ceramics (μm) |
|---|---|---|---|---|---|---|---|---|---|
| 1 | PZT | 1.044 | 1.000 | 99 | 1.0110 | 0.4099 | 0.4110 | 1.00268 | 40 |
| 2 | PZT | 1.000 | 1.000 | 98 | 1.0110 | 0.4090 | 0.4103 | 1.00318 | 40 |
| 3 | PZT | 0.978 | 1.000 | 99 | 1.0120 | 0.4088 | 0.4104 | 1.00391 | 40 |
| 4 | PZT | 0.957 | 1.000 | 97 | 1.0130 | 0.4085 | 0.4103 | 1.00441 | 40 |
| 5 | PZT | 0.957 | 0.999 | 96 | 1.0125 | 0.4090 | 0.4107 | 1.00416 | 40 |
| 6 | PZT | 0.957 | 0.995 | 98 | 1.0130 | 0.4088 | 0.4106 | 1.00440 | 40 |
| 7 | PZT | 0.957 | 0.990 | 99 | 1.0135 | 0.4085 | 0.4105 | 1.00490 | 40 |
| 8 | PZT | 0.957 | 1.000 | 98 | 1.0120 | 0.4090 | 0.4104 | 1.00342 | 40 |
| 9 | PZT | 0.957 | 1.000 | 96 | 1.0110 | 0.4095 | 0.4105 | 1.00244 | 40 |
| *10 | PZT | 1.044 | 1.000 | 98 | 1.0008 | 0.4105 | 0.4114 | 1.00219 | 40 |
| 11 | PZT | 0.957 | 0.995 | 98 | 1.0125 | 0.4095 | 0.4111 | 1.00391 | 20 |
| 12 | PZT | 0.957 | 0.995 | 97 | 1.0125 | 0.4087 | 0.4103 | 1.00391 | 60 |
| *13 | PZT | 0.957 | 0.995 | 95 | 1.0125 | 0.4083 | 0.4100 | 1.00416 | 80 |
| *14 | PZT | 0.957 | 0.995 | 96 | 1.0125 | 0.4080 | 0.4097 | 1.00417 | 100 |
| *15 | PZT | 0.957 | 1.000 | 99 | 1.0130 | 0.4085 | 0.4103 | 1.00441 | 40 |
| 16 | PZT | 0.957 | 0.997 | 98 | 1.0138 | 0.4120 | 0.4136 | 1.00388 | 40 |
| 17 | PZT | 0.957 | 0.995 | 99 | 1.0120 | 0.4087 | 0.4101 | 1.00350 | 40 |
| 18 | PZT | 0.957 | 0.995 | 95 | 1.0120 | 0.4085 | 0.4099 | 1.00340 | 40 |
| *19 | PZT | 0.957 | 0.992 | 98 | 1.0140 | 0.4125 | 0.4140 | 1.00360 | 40 |
| *20 | PZT | 1.044 | 0.990 | 998 | 1.0009 | 0.4083 | 0.4098 | 1.00367 | 40 |
| *21 | PZT | 1.044 | 1.002 | 997 | 1.0009 | 0.4086 | 0.4099 | 1.00318 | 40 |
| *22 | PZT | 0.957 | 1.001 | 989 | 1.0113 | 0.4085 | 0.4087 | 1.00049 | 40 |
| *23 | PZT | 0.947 | 1.000 | 994 | 1.0115 | 0.4090 | 0.4104 | 1.00340 | 40 |
| *24 | PZT | 0.947 | 0.999 | 985 | 1.0120 | 0.4100 | 0.4115 | 1.00370 | 40 |
| *25 | PZT | 0.960 | 1.001 | 979 | 1.0118 | 0.4118 | 0.4132 | 1.00340 | 40 |
| *26 | PZT | 0.967 | 1.002 | 994 | 1.0114 | 0.4150 | 0.4167 | 1.00400 | 40 |
| *27 | PZT | 0.957 | 1.000 | 958 | 1.0130 | 0.4085 | 0.4103 | 1.00441 | 40 |
| *28 | PZT | 0.957 | 0.995 | 994 | 1.0130 | 0.4088 | 0.4106 | 1.00440 | 40 |
| *29 | PZT | 0.957 | 0.995 | 496 | 1.0130 | 0.4088 | 0.4106 | 1.00440 | 40 |
| 30 | PZT | 0.957 | 0.995 | 198 | 1.0130 | 0.4088 | 0.4106 | 1.00440 | 40 |
| 31 | PZT | 0.957 | 0.995 | 97 | 1.0130 | 0.4088 | 0.4106 | 1.00440 | 40 |
| 32 | PZT | 0.957 | 0.995 | 48 | 1.0130 | 0.4088 | 0.4106 | 1.00440 | 40 |
| 33 | PZT | 0.957 | 0.995 | 10 | 1.0130 | 0.4088 | 0.4106 | 1.00440 | 40 |
| *34 | PZT | 0.957 | 0.995 | 5 | 1.0130 | 0.4088 | 0.4106 | 1.00440 | 40 |

TABLE 1-continued

| Sample No.[1] | Main crystal phase | Zr/Ti (molar ratio) | A/B (molar ratio) | Amount of Si in synthetic raw material (ppm) | c/a | Lattice constant of c-axis Before grinding (nm) | Lattice constant of c-axis After grinding (nm) | After grinding/ Before grinding | Total thickness of ceramics (μm) |
|---|---|---|---|---|---|---|---|---|---|
| *35 | PZT | 0.957 | 0.995 | 1 | 1.0130 | 0.4088 | 0.4106 | 1.00440 | 40 |
| 36 | PZT | 0.957 | 0.995 | 98 | 1.0135 | 0.4091 | 0.4109 | 1.00440 | 40 |
| 37 | PZT | 0.970 | 1.000 | 98 | 1.0120 | 0.4087 | 0.4090 | 1.00073 | 40 |

[1] The samples marked "*" are out of the scope of the present invention.

TABLE 2

| Sample No.[1] | Electrode Ag/Pd volume ratio | Average crystal particle diameter (μm) | Intergranular fracture ratio | Insulation resistance Before drive test (GΩ) | Insulation resistance After drive test (GΩ) | Second phase containing Ag | Void ratio (%) | $Zn_2SiO_4$ Phase | $Pb_2SiO_4$ Phase |
|---|---|---|---|---|---|---|---|---|---|
| 1 | 70/30 | 1.7 | 81% | 61 | 55 | Absence | 0.1% or less | Presence | Absence |
| 2 | 70/30 | 1.7 | 85% | 88 | 80 | Absence | 0.1% or less | Presence | Absence |
| 3 | 70/30 | 1.75 | 85% | 99 | 90 | Absence | 0.1% or less | Presence | Absence |
| 4 | 70/30 | 1.65 | 85% | 104.5 | 95 | Absence | 0.1% or less | Presence | Absence |
| 5 | 70/30 | 1.65 | 95% | 110 | 100 | Absence | 0.1% or less | Presence | Absence |
| 6 | 70/30 | 1.6 | 95% | 110 | 100 | Absence | 0.1% or less | Presence | Absence |
| 7 | 70/30 | 1.6 | 95% | 110 | 100 | Absence | 0.1% or less | Presence | Absence |
| 8 | 80/20 | 1.9 | 85% | 55 | 50 | Absence | 0.1% or less | Presence | Absence |
| 9 | 90/10 | 2.4 | 82% | 11 | 10 | Absence | 0.1% or less | Presence | Absence |
| *10 | 95/5 | 2.8 | 50% | 1 | 1 | Absence | 0.1% or less | Presence | Absence |
| 11 | 70/30 | 1.95 | 82% | 88 | 80 | Absence | 0.1% or less | Presence | Absence |
| 12 | 70/30 | 1.7 | 82% | 110 | 100 | Absence | 0.1% or less | Presence | Absence |
| *13 | 70/30 | 1.65 | 85% | 1 | 1 | Absence | 0.1% or less | Presence | Absence |
| *14 | 70/30 | 1.6 | 90% | 1 | 0.9 | Absence | 0.1% or less | Presence | Absence |
| *15 | Powder addition | 2.5 | 15% | 0.6 | 0.5 | Presence | 0.1% or less | Presence | Absence |
| 16 | 70/30 | 2.4 | 85% | 99 | 90 | Absence | 0.1% or less | Presence | Absence |
| 17 | 60/40 | 1.5 | 90% | 22 | 20 | Absence | 0.1% or less | Presence | Absence |
| 18 | 50/50 | 1.2 | 90% | 11 | 10 | Absence | 0.1% or less | Presence | Absence |
| *19 | 70/30 | 2 | 20% | 0.9 | 0.6 | Absence | 7.6% | Presence | Absence |
| *20 | 70/30 | 2.4 | 15% | 1 | 0.03 | Absence | 0.1% or less | Presence | Presence |
| *21 | 70/30 | 2.7 | 15% | 1 | 0.02 | Absence | 0.1% or less | Presence | Presence |
| *22 | 70/30 | 2.5 | 15% | 22 | 0.03 | Absence | 0.1% or less | Presence | Presence |
| *23 | 70/30 | 2.6 | 15% | 33 | 0.03 | Absence | 0.1% or less | Presence | Presence |
| *24 | 70/30 | 2.7 | 15% | 39 | 0.02 | Absence | 0.1% or less | Presence | Presence |
| *25 | 70/30 | 2.7 | 15% | 2 | 0.03 | Absence | 0.1% or less | Presence | Presence |
| *26 | 70/30 | 2.7 | 15% | 1 | 0.02 | Absence | 0.1% or less | Presence | Presence |
| *27 | Powder addition | 3.5 | 15% | 0.2 | 0.01 | Presence | 0.1% or less | Presence | Presence |
| *28 | 70/30 | 2.6 | 97% | 28 | 0.03 | Absence | 0.1% or less | Presence | Presence |
| *29 | 70/30 | 2.4 | 96% | 50 | 0.02 | Absence | 0.1% or less | Presence | Presence |
| 30 | 70/30 | 1.9 | 96% | 61 | 55 | Absence | 0.1% or less | Presence | Absence |
| 31 | 70/30 | 1.6 | 95% | 110 | 100 | Absence | 0.1% or less | Presence | Absence |
| 32 | 70/30 | 1.6 | 95% | 110 | 100 | Absence | 0.3% | Presence | Absence |
| 33 | 70/30 | 1.5 | 96% | 110 | 100 | Absence | 0.8% | Presence | Absence |
| *34 | 70/30 | 1.2 | 95% | 110 | 100 | Absence | 5.4% | Absence | Absence |
| *35 | 70/30 | 0.7 | 95% | 110 | 100 | Absence | 6.3% | Absence | Absence |
| 36 | 70/30 | 4.1 | 81% | 110 | 100 | Absence | 0.1% or less | Presence | Absence |
| 37 | 90/10 | 2.3 | 87% | 11 | 10 | Absence | 0.1% or less | Presence | Absence |

[1] The samples marked "*" are out of the scope of the present invention.

From Tables 1 and 2, it can be seen that Samples. Nos. 1 to 9, 11, 12, 16 to 18, 30 to 33, 36 and 37, each being within the scope of the invention, have low void ratios, and maintain high insulation performance even after the drive test, respectively.

The invention claimed is:

1. A multilayer piezoelectric actuator comprising:
   a multilayered body comprising a plurality of piezoelectric ceramic layers containing a PZT phase as a main crystal phase; and
   an electrode layer containing Ag, which is disposed at least one of on the surface and in the interior of the multilayered body,
   wherein a lattice constant c of c-axis of the PZT phase is 0.4085 nm to 0.4100 nm, and a ratio of the lattice constant c of the c-axis of the PZT phase and a lattice constant a of a-axis, namely, the ratio c/a, is 1.011 or more;
   a second phase containing Ag different from the PZT phase is not substantially contained in the piezoelectric ceramic layer; and
   a $Zn_2SiO_4$ phase is contained at grain boundaries of the PZT phase, and a $Pb_2SiO_4$ phase is not substantially contained at the grain boundaries of the PZT phase.

2. The multilayer piezoelectric actuator according to claim 1, wherein an average crystal particle diameter of the PZT phase is 2.5 μm or less.

3. The multilayer piezoelectric actuator according to claim 1, wherein a lattice constant of the c-axis of the PZT phase measured by grinding the piezoelectric ceramic layer into powder having an average particle diameter of 2.5 μm is 1.002 times to 1.005 times of the lattice constant c of the c-axis of the PZT phase before grinding.

4. The multilayer piezoelectric actuator according to claim 1, wherein, when the piezoelectric ceramic layer is subjected to load fracture, 80% or more of particles in the fractured section thereof become intergranular fracture mode.

5. The multilayer piezoelectric actuator according to claim 1, wherein the thickness of the piezoelectric ceramic layer is 50 μm or less.

6. The multilayer piezoelectric actuator according to claim 1, wherein the electrode layer contains Ag—Pd alloy, and the ratio of Ag is 60% to 85% by volume.

7. A liquid discharge head comprising:
a passage member having a plurality of ink passages; and
the multilayer piezoelectric actuator according to claim 1 to be connected onto the passage member, wherein
displacement elements constituting the multilayer piezoelectric actuator are disposed on the ink passages of the passage member.

* * * * *